United States Patent [19]

Graul et al.

[11] 4,063,967

[45] Dec. 20, 1977

[54] METHOD OF PRODUCING A DOPED ZONE OF ONE CONDUCTIVITY TYPE IN A SEMICONDUCTOR BODY UTILIZING AN ION-IMPLANTED POLYCRYSTALLINE DOPANT SOURCE

[75] Inventors: Jürgen Graul, Gruenwald; Helmuth Murrmann, Ottobrunn, both of Germany

[73] Assignee: Siemens Aktiengesellschaft, Berlin & Munich, Germany

[21] Appl. No.: 621,071

[22] Filed: Oct. 9, 1975

[30] Foreign Application Priority Data

Oct. 18, 1974  Germany .............................. 2449688

[51] Int. Cl.² .................. H01L 21/265; H01L 21/225
[52] U.S. Cl. ...................................... 148/1.5; 29/578; 148/174; 148/188; 357/59; 357/91
[58] Field of Search .................. 148/1.5, 188, 174; 29/578; 357/59, 91

[56] References Cited

U.S. PATENT DOCUMENTS

| | | | |
|---|---|---|---|
| 3,460,007 | 8/1969 | Scott | 148/174 X |
| 3,548,233 | 12/1970 | Cave et al. | 357/59 X |
| 3,558,374 | 1/1971 | Boss et al. | 148/187 X |
| 3,607,449 | 9/1971 | Tokuyama et al. | 148/188 |
| 3,664,896 | 5/1972 | Duncan | 148/187 |
| 3,717,507 | 2/1973 | Abe | 148/1.5 |
| 3,764,413 | 10/1973 | Kakizaki et al. | 148/188 |
| 3,775,191 | 11/1973 | McQuhae | 148/1.5 |
| 3,928,095 | 12/1975 | Harigaya et al. | 148/188 |

Primary Examiner—L. Dewayne Rutledge
Assistant Examiner—W. G. Saba
Attorney, Agent, or Firm—Hill, Gross, Simpson, Van Santen, Steadman, Chiara & Simpson

[57] ABSTRACT

A semiconductor body is coated at selected areas thereof with a polycrystalline or amorphous semiconductor layer, a dopant is ion-implanted into such polycrystalline or amorphous layer and the resultant structure is then subjected to diffusion conditions to diffuse the dopant from the polycrystalline or amorphous layer into the select zone of the semiconductor body. This process causes very slight disturbances in the crystal lattice of the semiconductor body and provides an adjustable dopant concentration at select surface zones of the semiconductor body.

10 Claims, 6 Drawing Figures

METHOD OF PRODUCING A DOPED ZONE OF ONE CONDUCTIVITY TYPE IN A SEMICONDUCTOR BODY UTILIZING AN ION-IMPLANTED POLYCRYSTALLINE DOPANT SOURCE

BACKGROUND OF THE INVENTION

1. Field of the Invention

The invention relates to a semiconductor body and somewhat more particularly to a method of doping select zones of a semiconductor body and a transistor so-produced.

2. Prior Art

At the present time, there are basically two processes for producing semiconductor components with doped zones therein. One is by diffusion and the other is by ion implantation.

In a diffusion process, the concentration of a dopant on the surface of a semiconductor body and the dopant profile or distribution therein is determined by the solubility of the dopant in the semiconductor body, the select diffusion temperature and the diffusion procedure employed. A typical procedure is, for example, to split up the doping process into a first step of coating a determinate quantity of dopant onto a select surface zone of a semiconductor body and, a second step of diffusion dopant from the coating into the semiconductor body in order to set the position of the pn-junction. Because of the generally very high concentration of dopant atoms on the surface of a so-treated semiconductor body, lattice distortions tend to occur and detract from the desired characteristics of the resultant semiconductor body.

High dopant concentrations on the surface of a semiconductor body may be avoided by ion implantation doping because in this type of doping process the quantity and position of the dopant atoms are determined by the ion energy and implantation dosage utilized. However, the implanted ions or atoms cause lattice disturbances due to beam damage, which must be healed or removed by a subsequent heat treatment. At high implantation dosages (i.e., dopant concentrations greater than $10^{18}$ cm$^{-3}$), such beam damage, which is often in the form of so-called "damage complexes" (for example, in the form of a combination of a lattice vacancy and an oxygen atom), can only be fully removed at relatively high temperatures, i.e., above 1000° C.

SUMMARY OF THE INVENTION

The invention provides a process for doping a limited zone of a semiconductor body whereby the dopant concentration may be readily controlled and lattice damage or disturbance is maintained at a minimum. Doping, in accordance with the principles of the invention, is effected by diffusion a dopant from a polycrystalline/amorphous semiconductor layer positioned at a select limited zone of the semiconductor body. At least a portion of the remaining polycrystalline/amorphous layer may also function as an ohmic contact for the semiconductor body. The invention also includes the transistor produced by the foregoing method.

Generally, in the practice of the invention, the dopant is introduced into the polycrystalline and/or amorphous semiconductor layer or layers positioned on the semiconductor body by ion implantation. Somewhat more specifically, the process of the invention comprises producing a doped zone of one conductivity type in a semiconductor body by positioning or applying one or more polycrystalline or amorphous semiconductor layers onto select surface zones of a semiconductor body, ion-implant a dopant into such layer or layers and diffusing the dopant from such layer into the select zone of the semiconductor body. The invention also includes the transistor produced by such a process.

DESCRIPTION OF THE PREFERRED EMBODIMENTS

Figure 1:
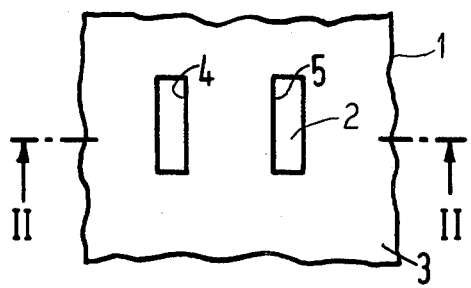
FIG. 1 is a partial plan view of a semiconductor body having two windows therein.

In accordance with the principles of the invention, diffusion of dopants into a monocrystalline semiconductor is effected from one or more doped polycrystalline or amorphous semiconductor layers. In this manner, the surface concentration of the dopant in the semiconductor body is determined by freely selectable parameters, i.e., on the dopant concentration in the layer and on the diffusion temperature and duration. Doping of the polycrystalline or amorphous semiconductor layers is effected with a high degree of accuracy by ion implantation. Any beam damage which may result by the implantation is of no significance in the polycrystalline or amorphous semiconductor layers.

A feature of the invention comprises forming or applying a masking layer on the semiconductor body before the application of the polycrystalline or amorphous layers thereon.

By masking the semiconductor body, for example, with an oxide or nitride layer, and then opening windows in such masking layer via a conventional photo-lacquer-etching technique, before the application of the polycrystalline or amorphous semiconductor layer in which the dopant atoms are to be implanted, it is feasible, in a simple, precise and highly economical manner to limit doping of the semiconductor body to select localized zones.

A further feature of the invention comprises removing select portions of the applied polycrystalline or amorphous layers having dopant atoms therein and utilizing the remaining portions of such layers as ohmic contacts for the electronic components formed from such semiconductor body.

The invention is useful for doping all known semiconductor materials, particularly the semiconductors composed of elements in Groups IV, III-V and II-V of the Periodic Chart of the Atoms and mixed crystals thereof.

The layers containing implanted ions therein are composed of the above-referenced semiconductor materials in polycrystalline or amorphous form. Of course, mixtures of such materials and/or a plurality of such layers may also be utilized.

A transistor produced by the process of the invention is characterized by providing an integral of the charge carrier density over the base width thereof divided by the diffusion coefficient (the so-called "Gummel coefficient") and multiplied by the maximum d.c. amplification equal to at least a factor of five times greater than in diffused and implanted transistors without polycrystalline or amorphous layers over the doped zones thereof.

Transistors produced in accordance with the process of the invention are also characterized to provide emitter-base-leakage currents that are at least a factor of five times smaller than in implanted transistors without polycrystalline or amorphous layers over the doped zones thereof.

For the sake of simplicity, an exemplary embodiment of the invention will be explained in detail with a monocrystalline silicon body which is to be doped in accordance with the invention with arsenic implanted in a polycrystalline silicon layer. However, it is to be understood that other semiconductor materials and dopants may also be used in the practice of the invention.

Figure 2:
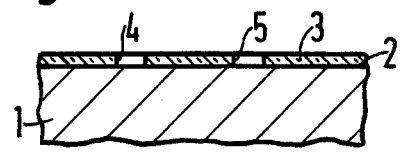
FIG. 2 is a partial cross-sectional view taken substantially along lines II—II of FIG. 1.

Referring now to FIG. 1, a monocrystalline silicon body 1 is coated with a thermally or pyrolytically produced silicon dioxide layer 3 and windows 4 and 5 are etched into layer 3 by known photo-lacquer-etching techniques so as to uncover a monocrystalline silicon surface 2 of body 1. This stage of the process is illustrated at FIGS. 1 and 2.

Figure 3:
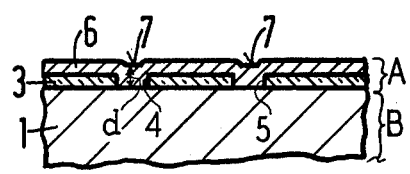
FIG. 3 is a view somewhat similar to that of FIG. 2 illustrating a process step of the invention.

As shown at FIG. 3, the next process step comprises applying, for example, pyrolytically, a polycrystalline silicon layer 6 onto the surface of layer 3 and onto the uncovered surface 2 of body 1. The thickness of layer 6 is controlled so as to be in the range of about 0.15μm to 0.5μm. Arsenic ions are then implanted into silicon layer 6. The implantation energy, $E_i$, is selected to be of such magnitude that the maximum of the disturbance caused thereby is within the layer 6. For example, when layer 6 is of a thickness of about 0.3 μm, $E_i$ is selected to be smaller than 300 keV. In this manner, the structure shown at FIG. 3 having a doped polycrystalline silicon layer 6 is attained.

Figure 4:
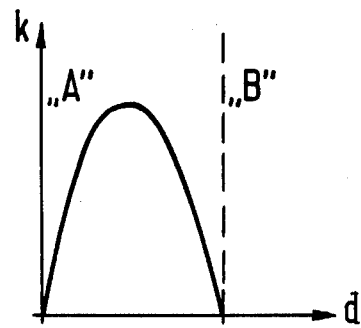
FIG. 4 is a graphical illustration of a dopant profile in a polycrystalline silicon layer after implantation of arsenic.

FIG. 4 illustrates the distribution or profile or arsenic in the polycrystalline layer 6 after an implantation process, when an implantation dosage of about $5 \times 10^{14}$ to $5 \times 10^{16}$ cm$^{-2}$ is utilized. In this illustration, the arsenic concentration, $k$, is plotted along the ordinate and the distance, $d$, to the surface 7 of the polycrystalline silicon layer 6 above windows 4 and 5 is plotted along the abscissa. The pertinent zones of the polycrystalline silicon layer 6 and of the monocrystalline silicon body 1 are respectively indicated by "A" and "B."

Figure 5:
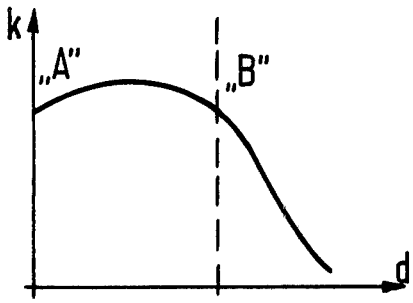
FIG. 5 is a graphical illustration of a dopant profile in a polycrystalline silicon layer and in a monocrystalline semiconductor body after implantation and diffusion in accordance with the principles of the invention.

After ion implantation of arsenic into the layer 6 is completed, the resultant structure is subjected to a diffusion process. For example, by subjecting a semiconductor body having a doped polycrystalline layer 6 thereon to a diffusion temperature of about 950° C. for a duration of about 30 minutes, the implanted arsenic atoms diffuse out of layer 6 and into body 1, as graphically illustrated at FIG. 5. In this manner, localized arsenic-doped zones 8 and 9 are produced beneath windows 4 and 5 in a semiconductor body 1.

Figure 6:
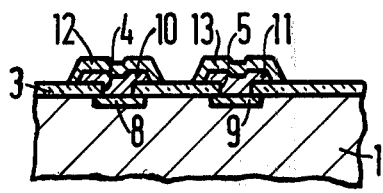
FIG. 6 is a partial elevated view of a semiconductor body after implantation, diffusion and metallization in accordance with the principles of the invention.

Next, a suitable phot-lacquer mask is applied so as to protect areas of the layer 6 above and slightly overlapping the doped zones 8 and 9. The remaining portions of layer 6 are then removed from layer 3 via a suitable etchant so that only islands 10 and 11 remain above windows 4 and 5 (of course, after removal of the unprotected areas of layer 6, the remaining photo-lacquer is also removed in a conventional manner). The resultant islands 10 and 11, comprised of doped polycrystalline silicon, function as ohmic contacts for subsequently applied conductor paths 12 and 13 as shown at FIG. 6.

Integrated bipolar transistors having emitter zones doped with arsenic and produced in accordance with the above described process exhibit a maximum current amplification up to a factor of 500 and cutoff frequencies of up to 4 GHz.

The foregoing is considered as illustrative only of the principles of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention as claimed.

We claim as our invention:

1. A process for producing a doped zone of one conductivity type in a monocrystalline semiconductor body comprising:
    applying a dopant-impermeable masking layer onto a select surface of said semiconductor body, said masking layer having at least one window therein for providing access to at least one select zone of the semiconductor body which is to be doped;
    applying a polycrystalline semiconductor layer uniformly over said masking layer and said select zone of the semiconductor body;
    ion implanting a dopant in said polycrystalline semiconductor layer; and
    diffusing said dopant from the polycrystalline semiconductor layer through said window in the masking layer and into the select zone of the semiconductor body.

2. A process as defined in claim 1 including removing select portions of the polycrystalline semiconductor layer from the semiconductor body after the diffusion is completed and using the remaining portions of said layer as ohmic contacts.

3. A process as defined in claim 1 wherein a maximum distribution of the dopant implanted in the polycrystalline semiconductor layer, at least prior to the diffusion step, is within such layer.

4. A process as defined in claim 3 wherein the thickness of the polycrystalline semiconductor layer is in the range of about 0.15 to 0.5μm.

5. A process as defined in claim 1 wherein the semiconductor body is composed of silicon, the polycrystalline semiconductor layer is composed of silicon and the dopant is arsenic.

6. A process as defined in claim 5 wherein the thickness of the polycrystalline semiconductor layer is about 0.3 μm, the ion implantation energy is smaller than 300 keV and the diffusion step includes a diffusion temperature of about 950° C. and a diffusion duration of about 30 minutes.

7. A process for producing a doped zone of one conductivity type in a monocrystalline semiconductor body comprising:
    applying a dopant-impermeable masking layer onto a select surface of said semiconductor body, said making layer having at least one window therein for providing access to at least one select zone of the semiconductor body which is to be doped;

applying an amorphous semiconductor layer uniformly over said masking layer and said select zone of the semiconductor body;

ion implanting a dopant in said amorphous semiconductor layer; and diffusing said dopant from the amorphous layer through said window in the masking layer and into the select zone of the semiconductor body.

8. A process as defined in claim 7, including removing select portions of the amorphous semiconductor layer from the semiconductor body after diffusion is completed and using the remaining portions of said amorphous layer as ohmic contacts.

9. A process as defined in claim 7, wherein the semiconductor body is composed of silicon, the amorphous semiconductor layer is composed of silicon and the dopant is arsenic.

10. A process as defined in claim 9, wherein the thickness of the amorphous semiconductor layer is about 0.3 $\mu$m, the ion implantation energy is smaller than 300 keV and the diffusion step includes a diffusion temperature of about 950° C. and a diffusion duration of about 30 minutes.

* * * * *